(12) United States Patent
Ferrant

(10) Patent No.: US 6,421,799 B1
(45) Date of Patent: Jul. 16, 2002

(54) REDUNDANCY CORRECTION ROM

(75) Inventor: Richard Ferrant, Saint Ismier (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/364,704

(22) Filed: Jul. 30, 1999

(30) Foreign Application Priority Data

Jul. 31, 1998 (FR) .......................................... 98/10079

(51) Int. Cl.⁷ .............................................. G11C 29/00
(52) U.S. Cl. ...................... 714/718; 714/711; 714/763; 714/773; 714/804; 714/805; 714/819; 365/189.07; 365/200
(58) Field of Search ............................... 714/718, 753, 714/766, 804, 805, 711, 773, 763; 365/200, 189.07

(56) References Cited

U.S. PATENT DOCUMENTS

| | | | |
|---|---|---|---|
| 4,183,463 A | 1/1980 | Kemmetmueller | 714/804 |
| 4,592,024 A | 5/1986 | Sakai et al. | 365/200 |
| 4,689,792 A * | 8/1987 | Traynor | 714/753 |
| 4,729,117 A * | 3/1988 | Osaka | 365/200 |
| 4,768,193 A * | 8/1988 | Takemae | 714/711 |

FOREIGN PATENT DOCUMENTS

EP 0 381 405 B1 11/1994

* cited by examiner

*Primary Examiner*—Emmanuel L. Moise
(74) *Attorney, Agent, or Firm*—Lisa K. Jorgenson; Brian L. Johnson; Seed IP Law Group PLLC

(57) ABSTRACT

A ROM including an array, each cell of which is accessible by means of a column address and of a row address, includes a parity memory for storing the expected parity of each row and of each column, an electrically programmable one-time programmable address memory, a testing circuit for, during a test phase, calculating the parity of each row and of each column, comparing the calculated and expected parities for each row and each column, and in case they are not equal, marking the row or column in the address memory, and a correction circuit for, in normal mode, inverting the value read from the array cell, having its row and column marked in the address memory.

20 Claims, 3 Drawing Sheets

REDUNDANCY CORRECTION ROM

TECHNICAL FIELD

The present invention relates to the field of integrated circuit correction, and more specifically, to the redundancy correction of read-only memory (ROM) circuits.

BACKGROUND OF THE INVENTION

A ROM contains binary information which is written at its manufacturing, generally by using a coding mask specific to the data contained in the memory.

Several types of defects can appear in a ROM during its manufacturing. Some defects can make the memory completely inoperative, for example, an address decoding defect preventing a proper reading of the stored data. Other defects may concern a portion of the memory only, for example, when a cell provides in the read mode a value opposite to the expected value. This particular type of defect is considered hereafter.

A way of testing the proper manufacturing of a ROM consists of reading its content and checking that all the stored information is correct. This test operation is lengthy and expensive, and an embarked testing device is included in a ROM. Such a device is designed for, during a test phase, successively receiving all the data stored in the memory, adding them, multiplying them, etc. according to an adequate encryption algorithm, and comparing the final result with the result expected from the memory data. When the results are equal, the memory is assumed to be good.

ROMs are currently integrated in large digital circuits, to store information such as fonts in a display control circuit, or such as square roots in a tracking circuit or such as the microcode of an application. If a ROM of such a circuit is defective, the circuit is inoperative and is thrown away.

SUMMARY OF THE INVENTION

An advantage of an embodiment of the present invention is to provide a means of relatively simple implementation for repairing a possible manufacturing defect in a ROM.

An embodiment of the present invention provides a ROM including an array, each cell of which is accessible by a column address and a row address, including a parity memory for storing an expected parity of each row and of each column, an electrically programmable one-time programmable address memory, a testing circuit for, during a test phase, calculating a parity of each row and of each column, comparing calculated and expected parities for each row and each column, and in case the calculated and expected parities are not equal, marking the row or column in the address memory, and a correction circuit for, in normal mode, inverting a value read from the array cell having its row and column marked in the address memory.

According to an embodiment of the present invention, the address memory includes a marking column and a marking row respectively associated with the array rows and columns, the testing circuit marking a row by enabling a flag in the cell of same row of the marking column, and marking a column by enabling a flag in the cell of same column of the marking row.

According to an embodiment of the present invention, the address memory includes a column address memory in which the testing circuit marks a column by writing its column address and a row address memory in which the circuit marks a row by writing its row address.

According to an embodiment of the present invention, the ROM array is divided into several sub-arrays, each sub-array being associated with a parity memory and an address memory.

The foregoing features and advantages of embodiments of the present invention, will be discussed in detail in the following non-limiting and non-exhaustive description of specific embodiments in connection with the accompanying drawings.

DETAILED DESCRIPTION OF THE ILLUSTRATED EMBODIMENTS

An embodiment of the present invention provides storing, upon manufacturing of a ROM, an additional information equal to an expected parity of each of its columns and of each of its rows. A testing circuit is provided to recalculate, during a test phase, a parity of the columns and of the rows, to compare them with the expected stored parities. In case of an inequality, the column or row is marked by writing a flag into an electrically programmable cell of same column or same row provided for this purpose. A correction circuit is further provided for, in normal mode, inverting the data read from a cell, the row and the column of which have been marked.

Figure 1:
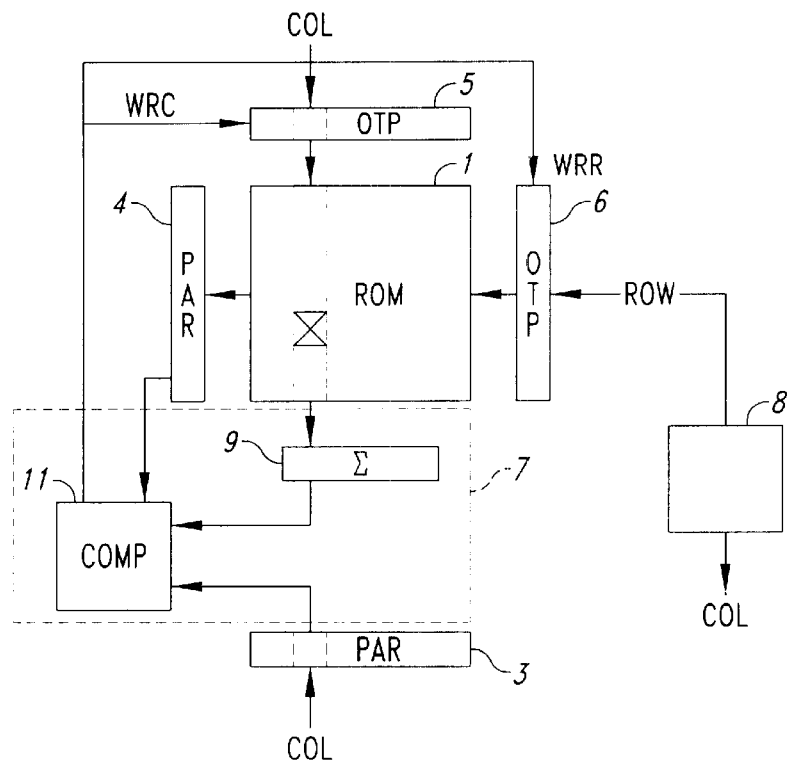
FIG. 1 schematically shows a ROM according to an embodiment of the present invention and circuits used in a test phase.

FIG. 1 shows a ROM array 1 with which are associated a parity row 3 and a parity column 4 formed of ROM cells and a marking row 5 and a marking column 6 formed of electrically programmable cells. These cells are permanently programmable, and may, for example, comprise fuses or erasable programmable read-only memory (EPROM) cells.

Rows 3 and 5 have cells respectively associated with columns of array 1, and both rows 3 and 5 receive the same column address COL as the array 1. Each cell of row 3 contains an information equal to the expected parity of a corresponding column of array 1.

Columns 4 and 6 have cells respectively associated with the rows of array 1, and both columns 4 and 6 receive the same row address ROW as the array 1. Each cell of column 4 contains an information equal to the expected parity of a corresponding row of array 1.

A testing circuit 7 for testing the columns, then the rows of the array 1, includes an adder 9 which receives data provided by the array 1, to calculate the parity of the columns and the parity of the rows of the array 1. Circuit 7 further includes a comparator 11 of the column parities provided by adder 9 and by row 3, and of the row parities provided by adder 9 and by column 4. Comparator 11 is connected to generate a control signal WRC for writing into marking row 5 if the comparator 11 detects an inequality between a calculated column parity generated by adder 9 and an expected column parity read from row 3. Similarly, comparator 11 is connected to generate a control signal WRR for writing into marking column 6 when it detects an inequality between a calculated row parity generated by adder 9 and an expected row parity read from column 4.

During a first test phase, a control circuit 8 provides the column and row addresses to successively read the cells of all rows of each column of array 1. Adder 9 thus calculates the parity of each column. Comparator 11 then compares, for each column, the calculated parity with the expected parity read from the corresponding cell of parity row 3. If the calculated parity and the expected parity are not equal, the column contains a defective cell and comparator 11 activates signal WRC to mark the column by writing a flag into the corresponding cell of marking row 5.

Similarly, parity column 4 and marking column 6 are provided for, during a second test phase carried out row by row, locating the row which contains the defective cell and marking it. At the end of the two test phases, the marking of the column and of the row enables exactly locating the defective cell.

Figure 2:
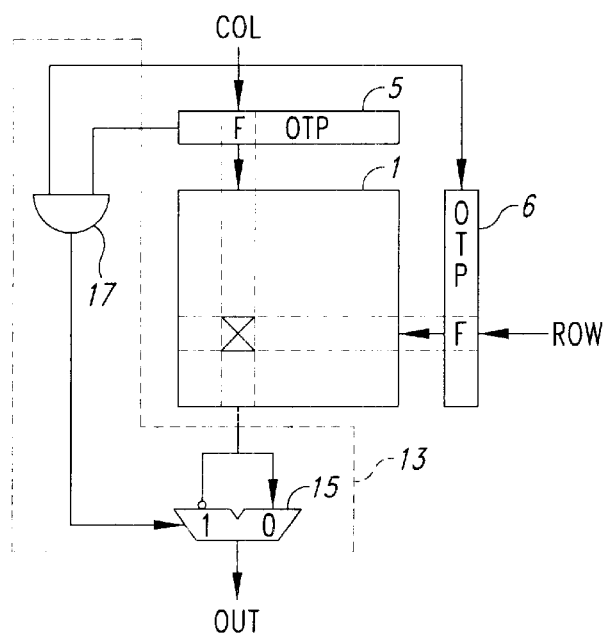
FIG. 2 schematically shows a ROM according to an embodiment of the present invention and circuits used in normal mode.

FIG. 2 shows the previously described array 1, marking row 5 and marking column 6, associated with circuits used in the normal operating mode of the memory. An output terminal of array 1 is connected to a correction circuit 13. Correction circuit 13 includes a multiplexer 15 having a normal input and an inverting input, both connected to the output terminal of array 1. Output terminals of marking row 5 and of marking column 6 are connected to a control terminal of multiplexer 15 via a logic gate 17 provided to select the inverting input of the multiplexer if flags are simultaneously present at the output of marking row 5 and of marking column 6.

When array 1 is read from at a column address COL and at a row address ROW, marking row 5 is also read from at column address COL and marking column 6 is read from at row address ROW. When the defective cell of array 1 is read from, flags appear at the two inputs of gate 17 and the data read from the defective cell are inverted. When another cell of array 1 is read from, the inputs of gate 17 are not simultaneously activated, and the content of the array is read as it is.

It should be noted that if a second cell, for example, of array 1 is defective in a column and row different from that of the first defective cell, the marking of two different columns and rows defines four locations instead of two. Thus, it is assumed that the manufacturing process of array 1 for the embodiment shown in FIG. 1 is sufficiently reliable to have only one defective cell in the array at the end of the manufacturing. If such is not the case, an alternative such as that which will be described in relation with FIG. 5 may be used.

Figure 3:
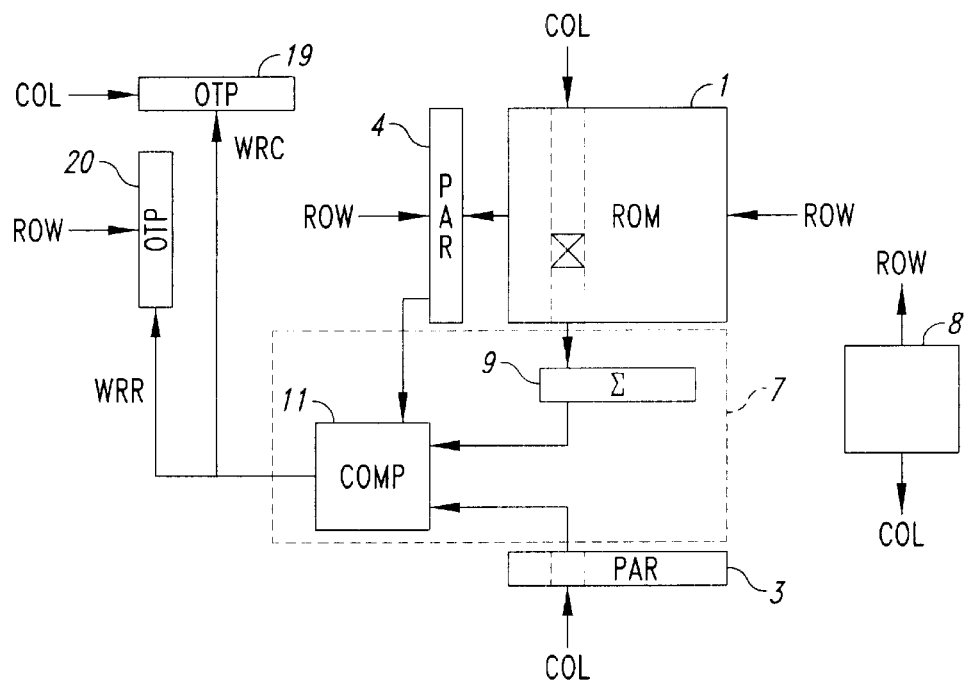
FIG. 3 schematically shows a ROM according to an alternative embodiment of the present invention and circuits used in a test phase.

FIG. 3 shows an alternative embodiment of the present invention. Array 1, rows 3 and 4, and testing circuit 7 are substantially the same as in FIG. 1. An electrically programmable column register 19 is connected to store address COL when it receives a signal WRC. An electrically-programmable row register 20 is connected to store address ROW when it receives a signal WRR.

In a first test phase, similar to the test phase performed column by column described in relation with FIG. 1, a column is searched, the calculated parity of which does not correspond to the expected parity. If such a column is found, its column address COL is written into column register 19.

Similarly, in a second test phase, similar to the test phase carried out row by row described in relation with FIG. 1, a row is searched, the calculated parity of which does not correspond to the expected parity. If such a row is found, its row address ROW is written into row register 20.

Figure 4:
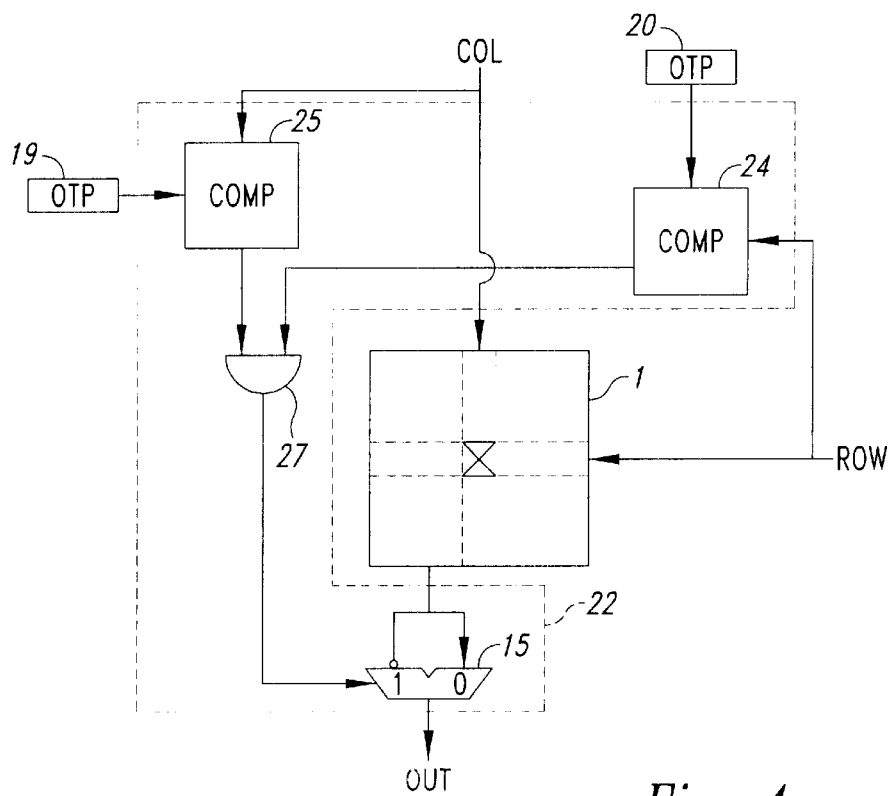
FIG. 4 schematically shows a ROM according to an alternative embodiment of the present invention and circuits used in normal mode.

FIG. 4 shows the previously described array 1, column register 19, and row register 20, during their use in normal mode. A correction circuit 22 includes a similar multiplexer 15 as correction circuit 13 of FIG. 2. It further includes two comparators 24 and 25, output terminals of which are connected to a control terminal of multiplexer 15 via a logic gate 27 provided to select the inverting input of multiplexer 15 when the outputs of comparators 24 and 25 are simultaneously active. Comparator 25 is connected to compare address COL with the address stored in column register 19. Similarly, comparator 24 is connected to compare address ROW with the address stored in row register 20.

When the defective cell of array 1 is read from, address COL is equal to the address stored in register 19, and the output of comparator 25 is activated. Similarly, address ROW then is also equal to the address stored in register 20, and the output of comparator 24 is activated. The inputs of gate 27 are activated and the data read from the defective cell are inverted. When the other array cells are read from, the outputs of comparators 24 and 25 are never simultaneously activated, and the data read from the cells are not inverted.

Figure 5:
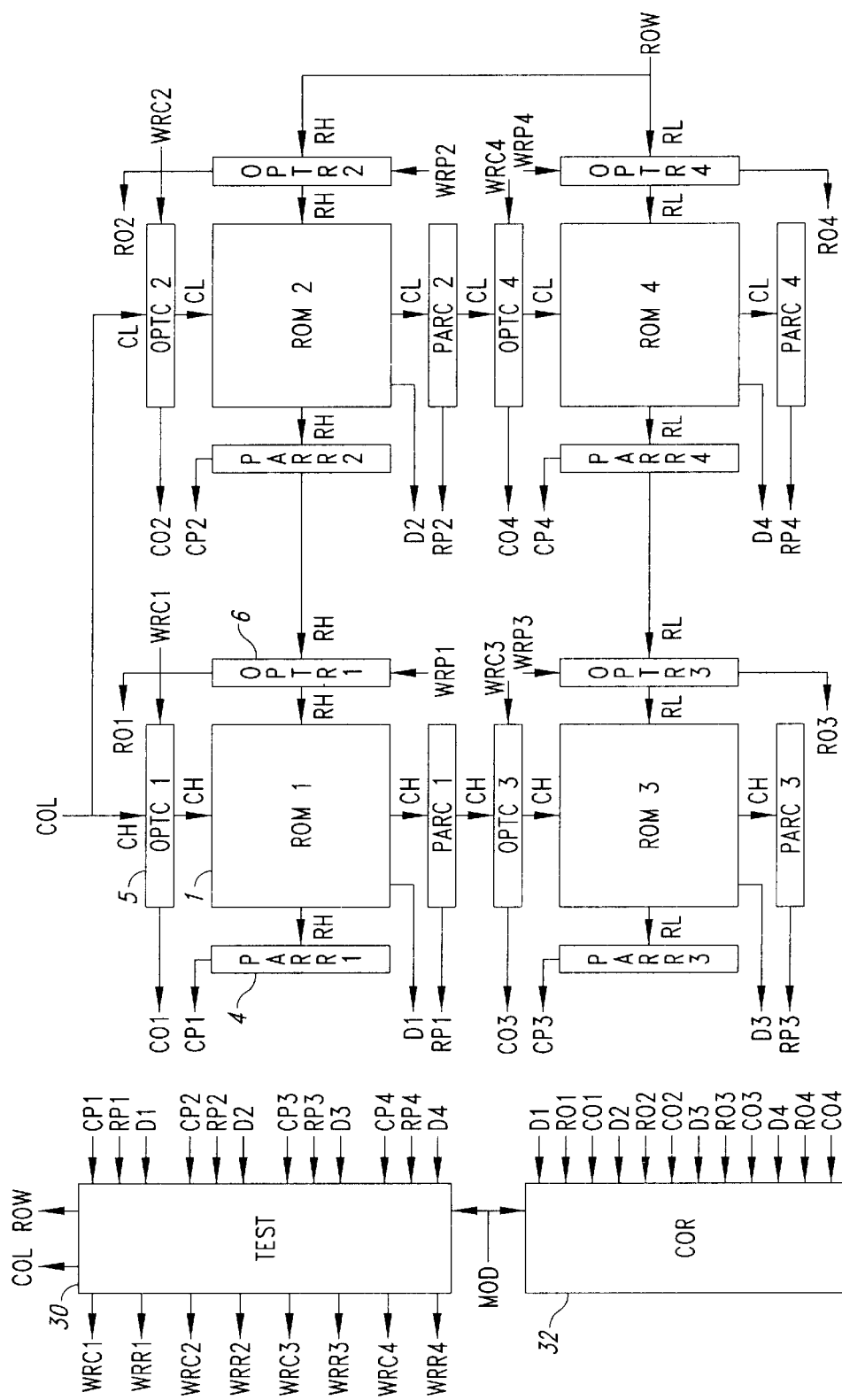
FIG. 5 schematically shows a ROM according to an alternative embodiment of the present invention.

FIG. 5 shows an alternative embodiment of the present invention enabling correction of four errors in a same array. For this purpose, the array is divided into four sub-arrays ROM1, ROM2, ROM3, ROM4, and each sub-array is processed similarly as array 1 of FIG. 1. Thus, each sub-array is associated with a marking row 5 (e.g., OTPC1, OTPC2, OTPC3, OTPC4), a marking column 6 (e.g., OTPR1, OTPR2, OTPR3, OTPR4), a parity row 3 (e.g., PARC1, PARC2, PARC3, PARC4), and a parity column 4 (e.g., PARR1, PARR2, PARR3, PARR4).

The column and row addresses are distributed so that sub-arrays ROM1 and ROM3 as well as the marking rows OTPC1, OTPC3 and parity rows PARC1, PARC3 associated therewith receive the upper half of the column addresses, and so that sub-arrays ROM2 and ROM4 as well as the marking rows OTPC2, OTPC4 and parity rows PARC2, PARC4 associated therewith receive the lower half of the column addresses. Similarly, sub-arrays ROM1 and ROM2 as well as the marking columns OTPR1, OTPR2 and parity columns PARR1, PARR2 associated therewith receive the upper half of the row addresses, and sub-arrays ROM3 and ROM4 as well as the marking columns OTPR3, OTPR4 and parity columns PARR3, PARR4 associated therewith receive the lower half of the row addresses.

A testing circuit 30 performs for each array the functions similar to that of testing circuit 7 and of control circuit 8 of FIG. 1. Circuit 30 receives output D of the sub-array (e.g., output D1 of sub-array ROM1), and outputs CP and RP of the parity row and column associated therewith (e.g., CP1 and RP1 for sub-array ROM1). Circuit generates during a test phase signals WRC and WRR (e.g., WRC1 and WRR1 for sub-array ROM1) for writing into marking row OTPC and into marking column OTPR associated with the sub-array (e.g., OTPC1 and OTPR1 for sub-array ROM1).

A control circuit 32 performs for each sub-array functions similar to that of control circuit 13 of FIG. 2. Circuit 32 receives output D of the sub-array, and outputs RO and CO of the marking row and column associated therewith (e.g., RO1 and CO1 for sub-array ROM1). Circuit 32 generates a signal DOUT equal to inverted signal D if signals RO and CO are simultaneously active, and equal to signal D otherwise. A mode selection control MOD enables activation of circuit 30 in test mode and of circuit 32 in normal mode.

This embodiment enables correction of four errors in the array, that is, one error per sub-array. The embodiment can be adapted to the correction of a greater number of errors. It should be noted that the embodiment of FIG. 5 uses testing circuits similar to those of FIGS. 1 and 2, and testing circuits similar to those of FIGS. 3 and 4 may also advantageously be used in the embodiment of FIG. 5.

A signature other than parity may also be used to test the array columns and rows. The expected signature of each column and of each row will then be stored in a row or column similar to those described previously, and the testing circuits will be provided for recalculating the signature during test phases.

Of course, embodiments of the present invention are likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims, which are to be construed in accordance with established doctrines of claim interpretation.

What is claimed is:

1. A read-only memory (ROM) having an array of cells, each cell of which is accessible by means of a column address and of a row address, the ROM comprising:
   a parity memory to store an expected parity of each row and of each column;
   an electrically programmable one-time programmable address memory;
   a testing circuit to, during a test phase, calculate a parity of each row and of each column, compare the calculated and expected parities for each row and each column, and if the calculated and expected parities are not equal, mark a row or column in the address memory; and
   a correction circuit to, in normal mode, invert a value read from an array cell having its row and column marked in the address memory.

2. The ROM of claim 1 wherein the address memory includes a marking column and a marking row respectively associated with array rows and columns, the testing circuit marking a row by enabling a flag in a cell of same row of the marking column, and marking a column by enabling a flag in a cell of same column of the marking row.

3. The ROM of claim 1 wherein the address memory includes a column address memory in which the testing circuit marks a column by writing its column address and a row address memory in which the testing circuit marks a row by writing its row address.

4. The ROM of claim 1 wherein the array comprises several sub-arrays, each sub-array being associated with a parity memory and an address memory.

5. The ROM of claim 1 wherein the correction circuit comprises:
   a multiplexer having inverting and non-inverting input terminals connected to an output of the array;
   a logic circuit having an output connected to a control terminal of the multiplexer and having inputs connected to outputs of the address memory, the logic circuit selecting the inverting input of the multiplexer if the calculated and expected parities are not equal.

6. The ROM of claim 1 wherein the array comprises several sub-arrays, with individual sub-arrays having a corresponding parity memory and a corresponding address memory, the testing circuit receiving outputs from the individual sub-arrays and outputs from the corresponding parity memories of the individual sub-arrays, the testing circuit generating a signal to mark a row and a column of a cell in the corresponding address memory of an individual sub-array if the expected and calculated parities are not equal.

7. A read-only memory (ROM), comprising:
   an of cells having individual cells arranged in rows and columns, the individual cells accessible by a column address and by a row address;
   a parity memory to store an expected parity of each row and each column of cells;
   an address memory; and
   a testing circuit to calculate a parity of each row and of each column, the testing circuit comparing the calculated and expected parities of each row and each column, the testing circuit marking a row or column in the address memory if the allocated and expected parities are not equal.

8. The ROM of claim 7, further comprising a correction circuit to invert a value read from a cell having its row and column marked in the address memory.

9. The ROM of claim 7 wherein the address memory comprises a marking column and a marking row respectively associated with the rows and columns of cells, the testing circuit marking a row by enabling a flag in a cell in the marking column corresponding to the row, the testing circuit marking a column by enabling a flag in a cell in the marking row corresponding to the column.

10. The ROM of claim 7 wherein the address memory includes a column address memory and a row address memory, the testing circuit marking a column by writing its column address in the column address memory, the testing circuit marking a row by writing its row address in the row address memory.

11. The ROM of claim 7 wherein the array comprises several sub-arrays, wherein an individual sub-array is associated to a corresponding parity memory and a corresponding address memory.

12. The ROM of claim 7, further comprising a correction circuit to invert a value read from a cell having its row and column marked in the address memory, the correction circuit comprising:
   a multiplexer having inverting and non-inverting input terminals connected to an output of the array;
   a logic circuit having an output connected to a control terminal of the multiplexer and having inputs connected to outputs of the address memory, the logic circuit selecting the inverting input of the multiplexer if the calculated and expected parities are not equal.

13. The ROM of claim 7 wherein the array comprises several sub-arrays with individual sub-arrays having a corresponding parity memory and a corresponding address memory, the testing circuit receiving outputs from the individual sub-arrays and outputs from the corresponding parity memories of the individual sub-arrays, the testing circuit generating a signal to mark a row and a column of a cell in the corresponding address memory of an individual sub-array if the expected and calculated parities are not equal.

14. A method of redundancy correction of a read-only memory (ROM) having an array of cells arranged in columns and rows and having individual cells accessible by column and row addresses, the method comprising:
   storing an expected parity of an array row and of an array column in a parity memory;
   calculating a parity of the array row and of the array column;

comparing the calculated parities of the array row and of the array column to respective expected parities;

marking a row and a column of an address memory corresponding to the array row and to the array column if the calculated and expected parities are not equal; and inverting a value of a cell having its array row and array column marked in the address memory.

15. The method of claim 14, further comprising:

providing the address memory with a marking column and a marking row; and respectively associating the marking column and the marking row with the array row and the array column, wherein marking a row of the address memory comprises enabling a flag in a cell of the marking column corresponding to the array row and wherein marking a column of the address memory comprises enabling a flag in a cell of the marking row corresponding to the array column.

16. The method of claim 14 wherein marking a row of the address memory comprises writing a row address of the array row in a row address memory, and wherein marking a column of the address memory comprises writing a column address of the array column in a column address memory.

17. The method of claim 14, further comprising:

dividing the array into a plurality of sub-arrays; and associating a parity memory and an address memory to a corresponding sub-array.

18. The method of claim 14, further comprising:

dividing the array into a plurality of sub-arrays;

associating a parity memory and an address memory to corresponding individual sub-arrays;

receiving outputs from the individual sub-arrays and outputs from their corresponding parity memories; and generating a signal to mark a row and a column of a cell in the corresponding address memory of an individual sub-array if the expected and calculated parities are not equal.

19. The method of claim 14, further comprising:

connecting an output of the array to inverting and non-inverting input terminals of a multiplexer;

connecting an output of a logic circuit to a control terminal of the multiplexer;

connecting outputs of the address memory to inputs of the logic circuit; and selecting the inverting input of the multiplexer if the calculated and expected parities are not equal.

20. The method of claim 14 wherein calculating the parities of the array row and of the array column comprises using an adder to calculate the parities.

* * * * *

UNITED STATES PATENT AND TRADEMARK OFFICE
CERTIFICATE OF CORRECTION

PATENT NO.    : 6,421,799 B1                                          Page 1 of 1
DATED         : July 16, 2002
INVENTOR(S)   : Richard Ferrant It is certified that error appears in the above-identified patent and that said Letters Patent is hereby corrected as shown below:

Column 6,
Line 7, "an of cells" should read as -- an array of cells --.
Line 17, "allocated and expected" should read as -- calculated and expected --.

Signed and Sealed this

Third Day of December, 2002

JAMES E. ROGAN
*Director of the United States Patent and Trademark Office*